United States Patent
Xiao et al.

(10) Patent No.: US 12,198,989 B2
(45) Date of Patent: Jan. 14, 2025

(54) METHOD FOR DETECTING RESISTANCE OF SIDE TRACE OF DISPLAY SUBSTRATE AND DISPLAY SUBSTRATE

(71) Applicant: BOE TECHNOLOGY GROUP CO., LTD., Beijing (CN)

(72) Inventors: Li Xiao, Beijing (CN); Jiao Zhao, Beijing (CN); Minghua Xuan, Beijing (CN); Dongni Liu, Beijing (CN); Haoliang Zheng, Beijing (CN); Zhenyu Zhang, Beijing (CN); Liang Chen, Beijing (CN); Hao Chen, Beijing (CN); Jing Liu, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 958 days.

(21) Appl. No.: 17/255,079

(22) PCT Filed: Nov. 29, 2019

(86) PCT No.: PCT/CN2019/121936
§ 371 (c)(1),
(2) Date: Dec. 22, 2020

(87) PCT Pub. No.: WO2021/102899
PCT Pub. Date: Jun. 3, 2021

(65) Prior Publication Data
US 2021/0375700 A1    Dec. 2, 2021

(51) Int. Cl.
*H01L 21/66* (2006.01)
*H01L 25/16* (2023.01)
*H01L 27/12* (2006.01)

(52) U.S. Cl.
CPC .............. *H01L 22/22* (2013.01); *H01L 22/32* (2013.01); *H01L 25/167* (2013.01); *H01L 27/124* (2013.01); *H01L 27/1259* (2013.01)

(58) Field of Classification Search
CPC ....... H01L 22/22; H01L 22/32; H01L 25/167; H01L 27/124; H01L 27/1259;
(Continued)

(56) References Cited

U.S. PATENT DOCUMENTS 11,646,400 B2 *   5/2023   Hong ................... H01L 25/167
                                                         257/79
2011/0317120 A1   12/2011  Kajiya et al.
(Continued)

FOREIGN PATENT DOCUMENTS

CN    101441339 A    5/2009
CN    101556519 A    10/2009
(Continued)

OTHER PUBLICATIONS

Office Action dated Oct. 20, 2022 issued in corresponding Chinese Application No. 201980002711.3.

*Primary Examiner* — Ratisha Mehta
(74) *Attorney, Agent, or Firm* — Nath, Goldberg & Meyer; Joshua B. Goldberg

(57) ABSTRACT

The present disclosure provides a method for detecting resistance of a side trace of a display substrate and the display substrate, and belongs to the field of display technology. In the method for detecting resistance of a side trace of a display substrate, the display substrate includes: a base substrate including a first surface and a second surface opposite to each other; a plurality of first pads at intervals on the first surface; and a plurality of second pads at intervals on the second surface; the first pad is electrically connected to a corresponding second pad through a side trace; the method includes forming at least one detection unit; wherein
(Continued)

forming the detection unit includes: connecting two first pads through a connection part; and detecting two second pads in the detection unit, and obtaining resistance of the detection unit to obtain the resistance of the side trace.

11 Claims, 6 Drawing Sheets

(58) Field of Classification Search
CPC .... H01L 23/488; G09G 3/3233; G09G 3/006; G09F 9/33
See application file for complete search history.

(56) References Cited

U.S. PATENT DOCUMENTS

| | | | |
|---|---|---|---|
| 2018/0233436 A1* | 8/2018 | Lee | H01L 23/3114 |
| 2019/0348357 A1* | 11/2019 | Lee | H05K 1/147 |
| 2021/0135076 A1* | 5/2021 | Jung | H01L 25/167 |

FOREIGN PATENT DOCUMENTS

| | | |
|---|---|---|
| CN | 102749743 A | 10/2012 |
| CN | 104201167 A | 12/2014 |
| CN | 104880877 A | 9/2015 |
| CN | 107180604 A | 9/2017 |
| CN | 107591117 A | 1/2018 |
| CN | 109461386 A | 3/2019 |
| CN | 109949708 A | 6/2019 |
| CN | 110161740 A | 8/2019 |
| JP | 2013182128 A | 9/2013 |
| KR | 20190048988 A | 5/2019 |

* cited by examiner

METHOD FOR DETECTING RESISTANCE OF SIDE TRACE OF DISPLAY SUBSTRATE AND DISPLAY SUBSTRATE

CROSS REFERENCE TO RELATED APPLICATION

This is a National Phase application filed under 35 U.S.C. 371 as a national stage of PCT/CN2019/121936, filed on Nov. 29, 2019, the entire contents of which are incorporated herein by reference.

TECHNICAL FIELD

The present disclosure belongs to the field of display technology, and particularly relates to a method for detecting resistance of a side trace of a display substrate and the display substrate.

BACKGROUND

Currently, most display panels are provided with a bezel, and wire bonding pads (e.g., IC bonding pads) are usually disposed on the periphery of the display area of a display panel. A full-screen bezel-free display product can provide a user with better viewing experience and will bring up a new consumer market. The full-screen technology gradually becomes the mainstream technology of handheld devices such as mobile phones, and currently, the GOA (Gate Driver On Array) technology is adopted to realize narrowing of a left and right bezel, and the COF (Chip On Film) technology is adopted to realize narrowing of a bottom bezel.

To truly realize no bezel, a front and back surface process of a display substrate is combined with a ULED (Ultra-LED) transfer printing to realize a bezel-free display technology, holes may be formed in a base substrate, and then the holes are filled with a metal to implement connection of signals at the front and back surfaces; alternatively, the front surface of the base substrate is provided with driving elements such as a thin film transistor, the back surface of the base substrate is provided with an IC bonding pad, and signals at the front and back surfaces are connected through a side binding process, so as to realize no bezel. In a case where the display substrate adopts the side trace process to connect signals at the front and back surfaces, the bezel is removed, the display area (AA area) has a limited internal space, only a pad of the side trace is left in the AA area, but the side trace is on the side surface of the substrate, which is unfavourable for resistance testing.

SUMMARY

The present disclosure is intended to at least solve one of the technical problems in the related art, and thus provides a method for detecting resistance of a side trace of a display substrate and the display substrate.

In a first aspect, an embodiment of the present disclosure provides a method for detecting resistance of a side trace of a display substrate, wherein the display substrate includes: a base substrate including a first surface and a second surface opposite to each other; a plurality of first pads disposed at intervals on the first surface; and a plurality of second pads disposed at intervals on the second surface; the first pad is electrically connected to a corresponding second pad through a side trace; the method includes steps of:

forming at least one detection unit; wherein forming the detection unit includes: connecting two of the plurality of first pads through a connection part; and detecting two second pads in the detection unit, and obtaining resistance of the detection unit to obtain the resistance of the side trace.

In an embodiment, the plurality of first pads include: a plurality of first signal pads and a plurality of first redundant pads; the plurality of second pads include: a plurality of second signal pads and a plurality of second redundant pads; the plurality of first signal pads and the plurality of second signal pads are arranged in one-to-one correspondence; the plurality of first redundant pads and the plurality of second redundant pads are arranged in one-to-one correspondence; and the step of forming the detection unit includes: connecting two of the plurality of first redundant pads through the connection part.

In an embodiment, the plurality of first pads include: a plurality of first signal pads and a plurality of first redundant pads; the plurality of second pads include: a plurality of second signal pads and a plurality of second redundant pads; the plurality of first signal pads and the plurality of second signal pads are arranged in one-to-one correspondence; the plurality of first redundant pads and the plurality of second redundant pads are arranged in one-to-one correspondence; and the step of forming the detection unit includes: connecting two of the plurality of first signal pads through the connection part.

In an embodiment, after the steps of detecting of the plurality of two second pads in the detection unit and obtaining resistance of the detection unit to obtain the resistance of the side trace, the method further includes: cutting off the connection part of each detection unit.

In an embodiment, the step of cutting off the connection part of each detection unit includes: cutting off the connection part in each detection unit with laser.

In an embodiment, forming the detection unit includes: connecting two adjacent first pads through the connection part.

In an embodiment, forming at least one detection unit includes forming a plurality of detection units.

In an embodiment, the two first pads in different detection units are different.

In a second aspect, an embodiment of the present disclosure provides a display substrate including:
a base substrate having a first surface and a second surface opposite to each other;
a plurality of first pads arranged at intervals on the first surface;
a plurality of second pads arranged at intervals on the second surface and in one-to-one correspondence with the plurality of first pads;
a plurality of side traces each configured to connect one of the plurality of first pads to a corresponding second pad; and
at least one connection part each configured to connect two first pads.

In an embodiment, the plurality of first pads include: a plurality of first signal pads and a plurality of first redundant pads; the plurality of second pads include: a plurality of second signal pads and a plurality of second redundant pads; the plurality of first signal pads and the plurality of second signal pads are in one-to-one correspondence; the plurality of first redundant pads and the plurality of second redundant pads are in one-to-one correspondence; and the connection part connects two first redundant pads.

In an embodiment, the plurality of first pads include: a plurality of first signal pads and a plurality of first redundant pads; the plurality of second pads include: a plurality of second signal pads and a plurality of second redundant pads; the plurality of first signal pads and the plurality of second signal pads are in one-to-one correspondence; the plurality of first redundant pads and the plurality of second redundant pads are in one-to-one correspondence; and the connection part connects two first signal pads.

In an embodiment, the two first pads connected by the connection part are adjacent to each other.

In an embodiment, a pixel unit is on the first surface of the base substrate, and the first pad is connected with the pixel unit through a signal introduction line; a plurality of third pads are arranged at intervals on the second surface of the base substrate, and the plurality of second pads are connected to the plurality of third pads in one-to-one correspondence.

In an embodiment, a plurality of third pads are arranged at intervals on the first surface of the base substrate, the plurality of first pads are connected to the plurality of third pads in one-to-one correspondence, a pixel unit is on the second surface of the base substrate, and the second pad is connected to the pixel unit through a signal introduction line.

In an embodiment, the at least one connection part comprises a plurality of the connection parts is multiple, and the two first pads connected by different connection parts are different.

DETAILED DESCRIPTION

Figure 1:
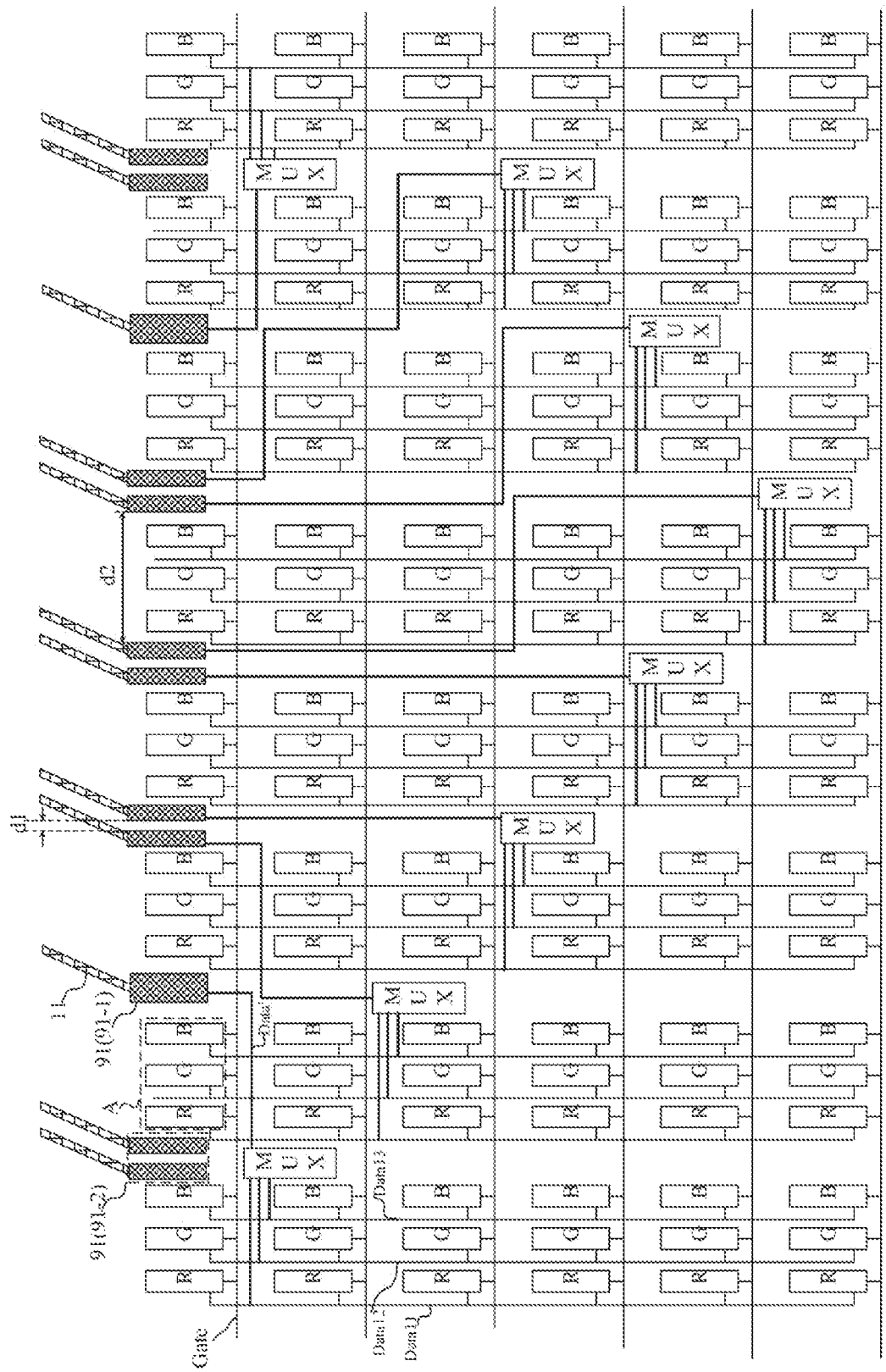
FIG. 1 is a schematic diagram of a display substrate according to an embodiment of the present disclosure.

In order that those skilled in the art can better understand technical solutions of the present disclosure, the present disclosure is further described in detail below in conjunction with the accompanying drawings and the specific implementations.

Unless defined otherwise, technical or scientific terms used herein shall have their ordinary meanings as understood by one of ordinary skill in the art to which this disclosure belongs. The use of "first," "second," and the like in this disclosure is not intended to indicate any order, quantity, or importance, but is used to distinguish one element from another. Also, the use of the terms "a," "an," or "the" and similar referents do not denote a limitation of quantity, but denote the presence of at least one. The word "include" or "comprise", and the like, means that the element or item preceding the word includes the element or item listed after the word and its equivalent, but does not exclude other elements or items. The terms "connect", "couple" and the like are not restricted to physical or mechanical connections, but may include electrical connections, whether direct or indirect. "upper", "lower", "left", "right", and the like are used only to indicate relative positional relationship, and when the absolute position of the object being described is changed, the relative positional relationship may also be changed accordingly.

It should be noted that, as shown in FIG. 1 to FIG. 4, a base substrate of a display substrate according to an embodiment of the present disclosure has a first surface 10-1 and a second surface 10-2 which are disposed opposite to each other. One of the first surface 10-1 and the second surface 10-2 is configured to be provided with a pixel unit A, and the other is configured to be provided with a third pad 93 bonded to IC. For convenience of description, a side of the base substrate where the pixel unit A is provided is taken as a first surface, and a side of the base substrate where the third pad 93 bonded to IC is provided is taken as a second surface. That is, in an embodiment of the present disclosure, the first pad 91 and the pixel unit A are disposed on the first surface 10-1 of the base substrate, and the second pad 92 and the third pad 93 are disposed on the second surface of the base substrate. The first pad 91 is connected to the pixel unit A through a signal introduction line 5, and is connected to the second pad 92 through a side trace 11, and the second pad 92 is connected to the third pad 93 through a fan-out trace 13. In this way, a signal provided by the IC to which the third pad is bonded can be transmitted to the pixel unit A through the fan-out trace 13, the side trace 11, and the signal introduction line 5. Of course, in an embodiment of the present disclosure, the first pad 91 and the third pad may be disposed on the first surface 10-1 of the base substrate, and the second pad 92 and the pixel unit A may be disposed on the second surface 10-2 of the base substrate. In this case, the second pad 92 is connected to the pixel unit A through the signal introduction line 5 and connected to the first pad 91 through the side trace 11, the first pad 91 is connected to the third pad 93 through the fan-out trace 13, and a signal provided by the IC can be transmitted to the pixel unit A through the fan-out trace 13, the side trace 11, and the signal introduction line 5.

Specifically, the first pads 91 disposed on the first surface 10-1 of the base substrate may be arranged in the same manner as and in one-to-one correspondence with the second pads 92 disposed on the second surface 10-2 of the base substrate. In some embodiments, an orthographic projection of each first pad 91 on the base substrate and an orthographic projection of the corresponding unique second pad 92 on the base substrate completely coincide with each other or almost coincide with each other within an allowable range of process error. Of course, it can be understood that the first pad 91 and the second pad 92 may have different shapes, and in this case, the orthographic projections of the first pad 91 and the second pad 92 on the base substrate may not coincide with each other completely. In addition, materials of the first pad 91 and the second pad 92 may be the same. Since the third pads 93 disposed on the second surface 10-2 of the base substrate need to be bonded to a chip, the third pads 93 are narrower than the second pads 92, and an interval between the third pads 93 matches a pin pitch (an interval between pins) of an integrated circuit, so that the interval between the third pads 93 is small.

For convenience of fabrication, the first pads 91 and the second pads 92 formed by processes both have a regular arrangement, and have a corresponding relationship with pixel units in the display panel. Thus, generally, the first pad 91 include a first signal pads 91-1 and a first redundant pad 91-2; the first signal pad 91-1 is configured to supply a signal to the display panel, the first redundant pad 91-2 is fabricated at the same time as the first signal pad 91-1, and therefore, the first redundant pad 91-2 may have the same structure as the first signal pad 91-1 and serve as a spare pad. Similarly, the second pad 92 include a second signal pad 92-1 and a second redundant pad 92-2; the second signal pad 92-1 is configured to be connected with the first signal pad 91-1 and supply a signal from the integrated circuit to the display panel, the second redundant pad 92-2 is fabricated at the same time as the second signal pad 92-1, and therefore, the second redundant pad 92-2 may have the same structure as the second signal pad 92-1 and serve as a spare pad. The first signal pad 91-1 is connected to the corresponding second signal pad 92-1 through a side trace; the first redundant pad 91-2 is connected to the corresponding second redundant pad 92-2 through a side trace.

Hereinafter, by taking a case in which the first signal pads 91-1 and the second signal pads 92-1 are used to supply data voltages to data lines in the display substrate as an example, arrangements of the first signal pads 91-1, the first redundant pads 91-2, the second signal pads 92-1, and the second redundant pad 92-2 as well as an arrangement of pixel units are described for exemplary purpose.

As shown in FIG. 1, the display substrate includes a plurality of pixel units A arranged in an array, and pixel units A in a same row are connected to a same gate line Gate. Each pixel unit A includes a red sub-pixel R, a green sub-pixel G and a blue sub-pixel B. Red sub-pixels R in a same column are connected to a same data line Data11, green sub-pixels G in a same column are connected to a same data line Data12, and blue sub-pixels B in a same column are connected to a same data lines Data13. Each column of pixel units A is connected to a data selector MUX through three corresponding data lines, and the data selector MUX is connected to the first pad 91 through a data voltage introduction line Data'.

As shown in FIG. 1, a case where the display panel includes eight columns of pixel units is taken as an example, considering a difference between loss of an electrical signal received by a column of pixel units in a middle area and loss of an electrical signal received by a column of pixel units in a side area due to different distances for signal transmission in the display panel, in the design, it is avoided to dispose a pad between columns of pixel units in the two side areas of the display panel, and more than two pads are disposed between columns of pixel units in the middle area of the display panel, as long as it is ensured that the number of pads is equal to or greater than the number of the columns of the pixel units. For example, pads disposed between the first column of pixel units and the second column of pixel units and between the seventh column of pixel units and the eighth column of pixel units are redundant pads, which are not connected with the data lines; one pad connected with the data line is disposed between the second column of pixel units and the third column of pixel units, and one pad connected with the data line is disposed between the sixth column of pixel units and the seventh column of pixel units; two pads connected with the data lines are disposed between the third column of pixel units and the fourth column of pixel units, two pads connected with the data lines are disposed between the fourth column of pixel units and the fifth column of pixel units, and two pads connected with the data lines are disposed between the fifth column of pixel units and the sixth column of pixel units. Thus, the difference in line resistances due to different lengths of different signal lines connected to different pixel columns can be reduced, and the problem of the difference in signal delay between different signal transmission lines can be reduced. That is, the display substrate shown in FIG. 1 includes 12 first pads 91 in total, the pads between any two columns of pixel units from the second column to the seventh column of pixel units are first signal pads 91-1, and the remaining pads between the pixel columns at both sides of the display panel are first redundant pads 91-2.

In some embodiments, the display substrate may include more columns of pixel units, and positions of the first signal pads 91-1 and the first redundant pads 91-2 may be set according to practical situations with reference to the concept of the embodiments of the present disclosure. For example, after the number of signal pads connected to respective pixel columns satisfies the need, a pad between the central columns of pixel units in the middle area of the display panel may be used as a redundant pad. When no first pad is disposed in an area between two adjacent columns of pixel units, a pattern such as a process alignment mark and the like may be provided in the area.

Figure 2:
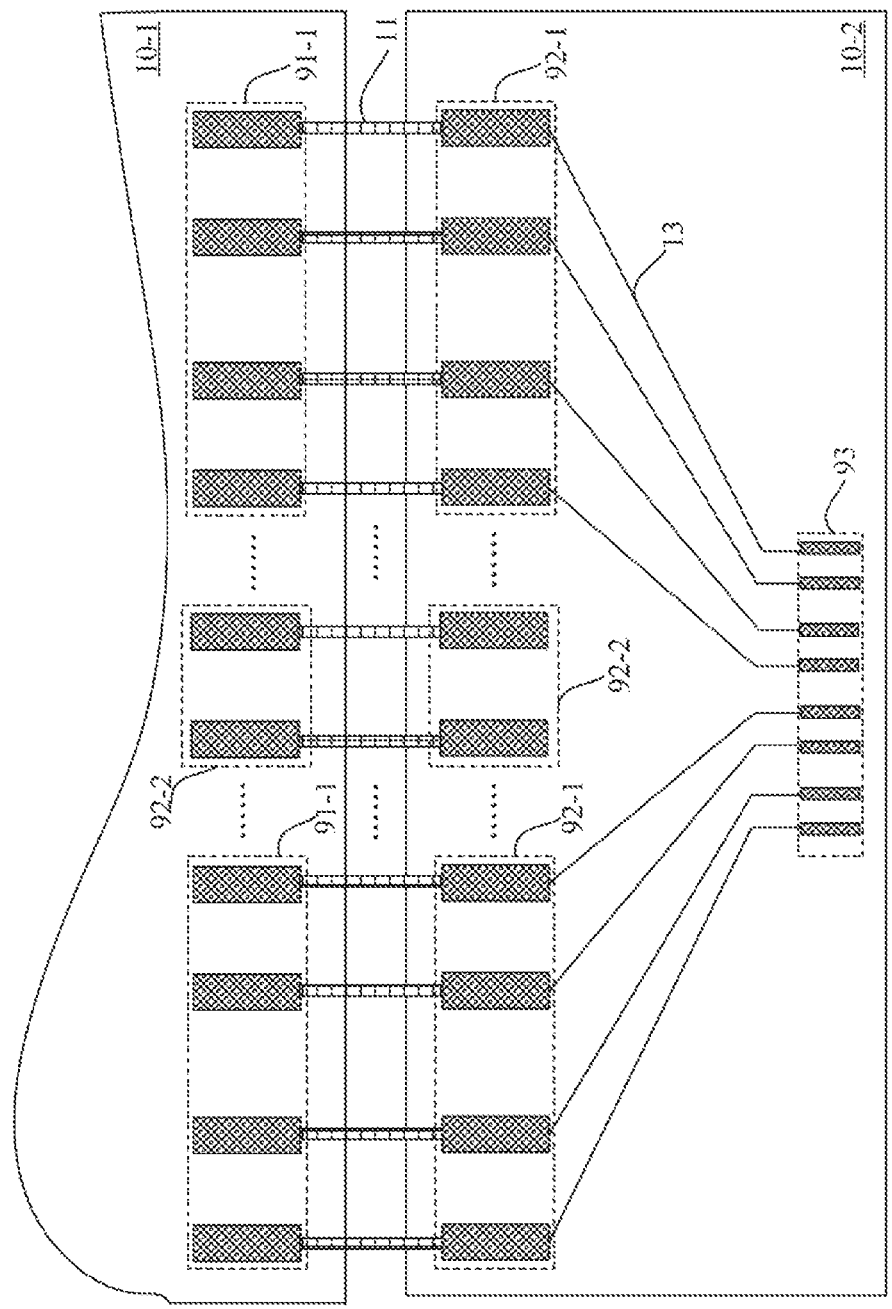
FIG. 2 is a schematic diagram of a layout of first pads, second pads, and third pads in a display substrate according to an embodiment of the present disclosure.

As shown in FIG. 2, in some embodiments, the second pads 92 are formed on the second surface 10-2 of the base substrate of the display substrate in an arrangement corresponding to the first pads 91. The first signal pad 91-1 is connected to the second signal pad 92-1 through a side trace 11; the first redundant pad 91-2 is connected to the second redundant pad 92-2 through a side trace 11. On the second surface 10-2 of the base substrate of the display substrate, the third pads 93 are arranged in the same layer as the second pads 92, and the number and the arrangement of the third pads 93 correspond to the number and the arrangement of pins of the integrated circuit to which the third pads are bonded. The second signal pads 92-1 of the second pads 92 are connected to the third pads 93 through fan-out traces 13.

In some embodiments, a minimum interval d1 and a maximum interval d2 between two adjacent first and/or second pads are adapted to an interval between columns of pixel units. For example, when the interval between pixel columns is about 400 μm, d1 may have a value of about 40 μm, and d2 may have a value of about 230 μm; each first pad 91 and/or second pad 92 have a width in the range of 60 μm to 100 μm, and it can be understood that, since columns of the pixel units are arranged at equal intervals, the area between two adjacent pixel columns is determined, and those skilled in the art can select and design the width of the first pad according to the number of pads between two adjacent pixel columns.

Figure 3:
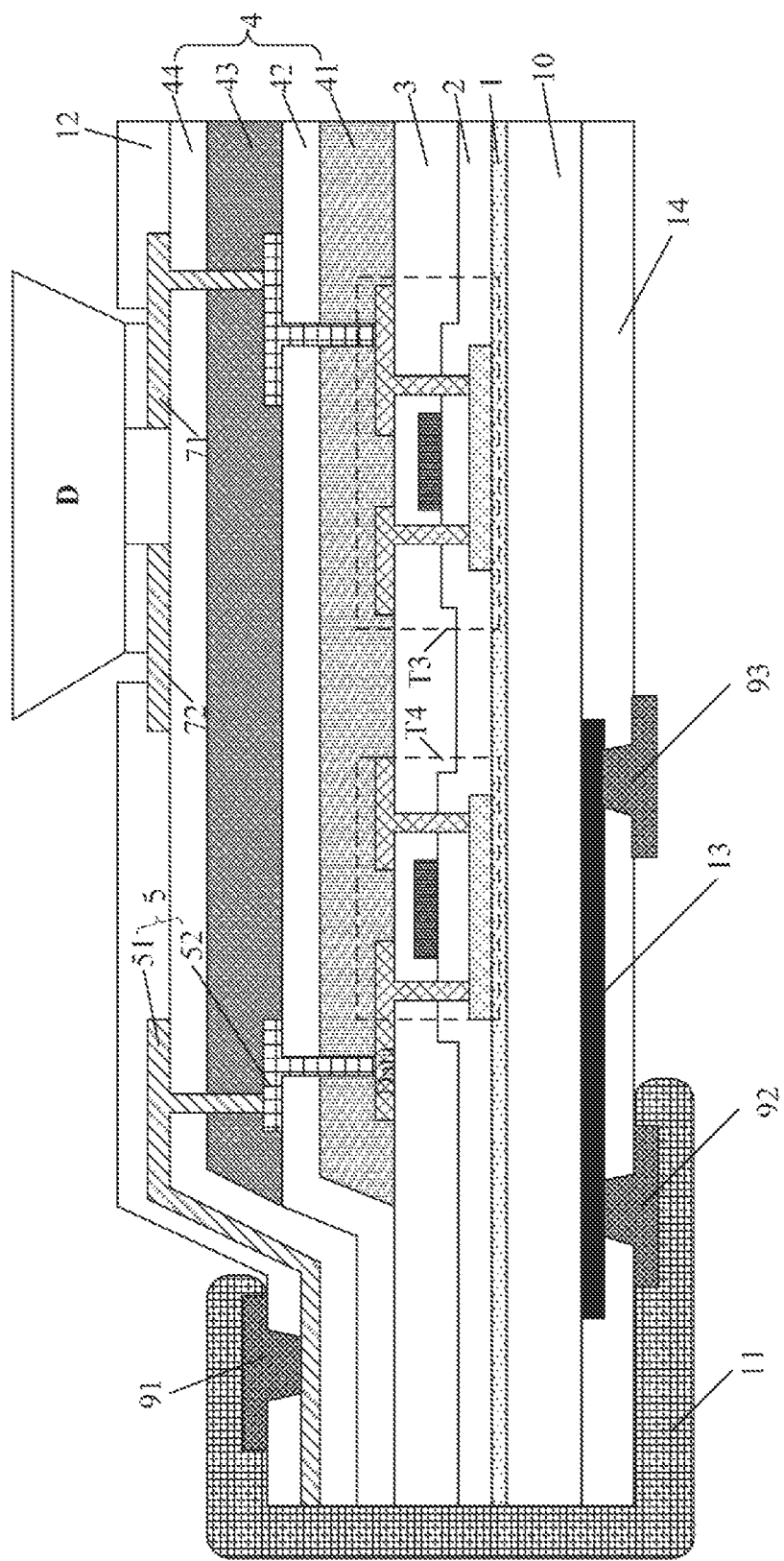
FIG. 3 is a cross-sectional view of a display substrate in an embodiment of the present disclosure.
Figure 4:
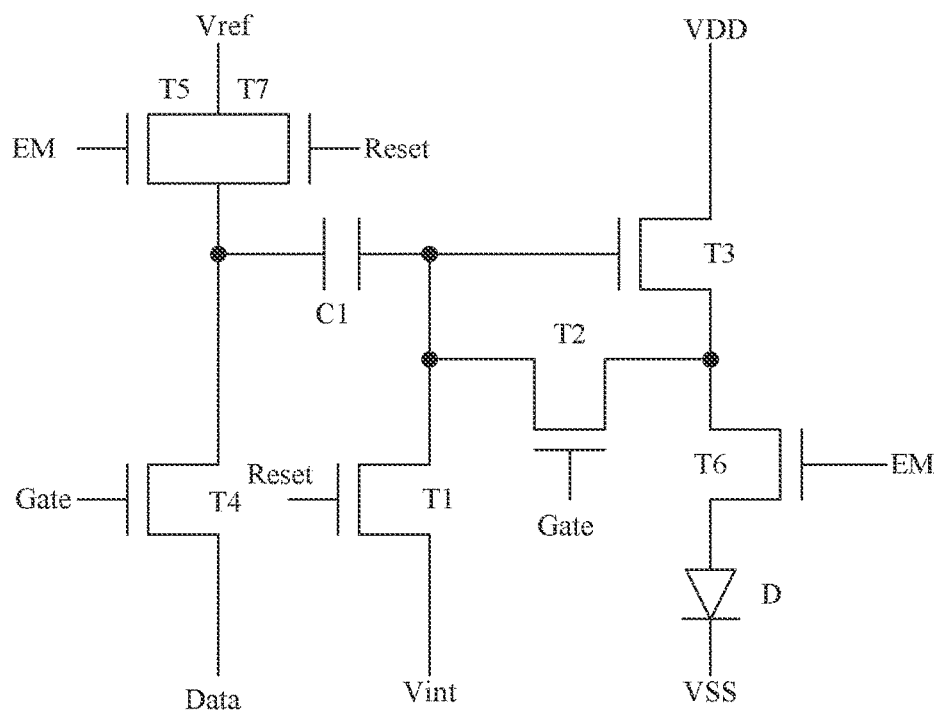
FIG. 4 is a circuit diagram of a pixel of a display substrate according to an embodiment of the present disclosure.

For process reasons, resistance values of the side traces 11 connected between the first pads 91 and the corresponding second pads 92 are almost the same, and therefore, in the embodiments of the present disclosure, the first side traces are considered to have a same resistance value. The fan-out traces, side traces and signal introduction lines for electrical connection may provide data voltage signals, power voltage signals and the like for the pixel units. As shown in FIG. 3, to make the specific structure of the display substrate of the embodiment of the present disclosure clear, firstly, FIG. 1 illustrates an exemplary structure of the display substrate to better understand the display substrate according to the embodiment of the present disclosure. It should be understood, however, that the display substrate should not be construed as limiting the scope of the embodiments of the present disclosure. A pixel circuit in the sub-pixel at least includes a switching transistor and a driving transistor, and of course may also include a threshold compensation transistor, a storage capacitor, and the like. FIG. 4 illustrates an exemplary pixel circuit. The pixel circuit specifically includes: a first reset transistor T1, a threshold compensation transistor T2, a driving transistor T3, a switching transistor T4, a first light emission control transistor T5, a second light emission control transistor T6, a second reset transistor T7, a first storage capacitor C1, and a light emitting device D. A first electrode of the first transistor T1 is connected to an initial voltage signal terminal Vint, a second electrode of the first reset transistor T1 is connected to a second terminal of the first storage capacitor C1, a first electrode of the threshold compensation transistor T2 and a control electrode of the driving transistor T3; and a control electrode of the first reset transistor T1 is connected to a reset signal terminal Reset. A second electrode of the threshold compensation transistor T2 is connected to a second electrode of the driving transistor T3 and a first electrode of the second light emission control transistor T6, and a control electrode of the threshold compensation transistor T2 is connected to a gate line Gate. A first electrode of the driving transistor T3 is connected to a first power supply voltage terminal VDD. A first electrode of the switching transistor T4 is connected to a data line Data, and a second electrode of the switching transistor T4 is connected to a second electrode of the first light emission control transistor T5, a second electrode of the second reset transistor T7, and a first electrode of the first storage capacitor C1. A control electrode of the switching transistor T4 is connected to the gate line. A first electrode of the first light emission control transistor T5 is connected to a reference voltage signal terminal Vref, and a control electrode of the first light emission control transistor T5 is connected to a light emission control line EM. A second electrode of the second light emission control transistor T6 is connected to a first electrode of the light emitting device D, and a control electrode of the second light emission control transistor T6 is connected to the light emission control line EM. A first electrode of the second reset transistor T7 is connected to the reference voltage signal terminal Vref, a control electrode of the second reset transistor T7 is connected to the reset signal terminal Reset, and a second electrode of the light emitting device is connected to a second power supply voltage terminal VSS.

The above used transistors may be thin film transistors or field effect transistors or other devices with the same characteristics, and since the source electrode and the drain electrode of the used transistor are symmetrical, there is no difference between the source electrode and the drain electrode. In the embodiments of the present disclosure, to distinguish the source electrode from the drain electrode of the transistor, one of the electrodes is referred to as a first electrode, the other electrode is referred to as a second electrode, and the gate electrode is referred to as a control electrode. In addition, transistors may be divided into N type transistors and P type transistors according to the characteristics of the transistors. When a P type transistor is adopted, the first electrode is the source electrode of the P type transistor, the second electrode is the drain electrode of the P type transistor, and when the gate electrode is supplied with a low level, the source electrode and the drain electrode are conducted. When an N type transistor is adopted, the first electrode is the source electrode of the N type transistor, the second electrode is the drain electrode of the N type transistor, and when the gate electrode is supplied with a high level, the source electrode and the drain electrode are conducted. The transistors in the pixel circuits are all described as N type transistors by way of examples, and it can be acknowledged that implementation of P type transistors is easily conceivable by those skilled in the art without creative efforts and therefore is also within the scope of the embodiments of the present disclosure.

The fan-out traces, the side traces, and the signal introduction line in connection can provide data voltage signals to the pixel units, and the signal introduction line 5 shown in FIG. 3 includes a first signal introduction sub-line 51 and a second signal introduction sub-line 52. The positional relationship of film layers shown in the cross-sectional view of the display substrate shown in FIG. 3 is described, FIG. 3 only shows part of devices, such as the switching transistor T4, the driving transistor T3, and the like, and description is given by taking the switching transistor T4 and the driving transistor T3 as top-gate thin film transistors as an example.

The display substrate includes: a base substrate 10, a buffer layer 1 on a first surface 10-1 of the base substrate; an active layer of the switching transistor T4 and an active layer of the driving transistor T3 which are in a same layer and on the buffer layer 1; a gate insulating layer 2 on a layer where the active layer of the switching transistor T4 and the active layer of the driving transistor T3 are located, the gate insulating layer 2 covering a display area and a bonding area; a gate electrode of the switching transistor T4 and a gate electrode of the driving transistor T3 which are in a same layer and on the gate insulating layer 2; a first insulating layer 3 on a layer where the gate electrode of the switching transistor T1 and the gate electrode of the driving transistor T3 are located, the first insulating layer 3 covering the display area and the bonding area; a source electrode and a drain electrode of the switching transistor T4, a source electrode and a drain electrode of the driving transistor T3, and a data line connected to the source electrode of the switching transistor T4, which are in a same layer and on the first insulating layer 3; a first planarization layer 41 on a layer where the source and drain electrodes of the switching transistor T4, the source and drain electrodes of the driving transistor T3, and the data line connected to the source electrode of the switching transistor T4 are located, the first planarization layer 41 being positioned only in the display area; a first passivation layer 42 on the first planarization layer 41, the first passivation layer 42 covering the display area and the bonding area; a second signal introduction sub-line 52 and a first connection electrode 6 which are in a same layer and on the first planarization layer 41; the second signal introduction sub-line 52 being connected to the data line through a first via hole penetrating through the first planarization layer 41 and the first passivation layer 42; and the first connection electrode 6 being connected to the drain electrode of the driving transistor T3 through a third via hole penetrating through the first planarization layer 41 and the first passivation layer 42; a second planarization layer 43 on a layer where the second signal introduction sub-line 52 and the first connection electrode 6 are located, the second planarization layer 43 being positioned only in the display area; a second passivation layer 44 on the second planarization layer 43, the second passivation layer 44 covering the display area and the bonding area; a first signal introduction sub-line 51, a first pad 71 and a second pad 72 which are in a same layer and on the second passivation layer 44; the first signal introduction sub-line 51 extending from the display area to the bonding area, and being connected to the second signal introduction sub-line 52 through a second via hole penetrating through the second planarization layer 43 and the second passivation layer 44; the first pad 71 being connected to the first connection electrode 6 through a fourth via hole penetrating through the second planarization layer 43 and the second passivation layer 44; and a third passivation layer 12 on the first signal introduction line sub-line 51, the first pad 71 and the second pad 72, wherein a first electrode of the light emitting device D is electrically connected to the first pad 71 through a fifth via hole penetrating through the third passivation layer, and a second electrode of the light emitting device D is electrically connected to the second pad 72 through the fifth via hole penetrating through the third passivation layer. A fan-out trace 13 is arranged on the second surface 10-2 of the base substrate, and a fourth passivation layer 14 is on the fan-out trace 13; a second pad 92 and a third pad 93 are on the fourth passivation layer 14; the second pad 92 is connected to one end of the fan-out trace 13 through a sixth via hole penetrating through the fourth passivation layer 14, and the third pad 93 is connected to the other end of the fan-out trace 13 through a seventh via hole penetrating through the fourth passivation layer 14; the first signal introduction sub-line 51 is connected to the first pad in the bonding area, and the first pad 91 is connected to the second pad 92 on the second surface 10-2 of the base substrate through a side trace 11.

The light emitting device D may be a Micro Inorganic Light Emitting Diode, and further, may be an electric current type light emitting diode, such as a Micro Light Emitting Diode (Micro LED) or a Mini Light Emitting Diode (Mini LED). Of course, the light emitting device D in the embodiments of the present disclosure may also be an Organic Light Emitting Diode (OLED). One of the first and second electrodes of the light emitting device D is an anode and the other is a cathode.

A too large resistance of the side trace 11 will lead to a severe IR drop (voltage drop), which causes a loss of an electrical signal transmitted to the pixel circuit, resulting in a display defect of the light emitting device D. Because one end of the side trace 11 is disposed on the first surface and the other end is disposed on the second surface, it is not convenient to measure the resistance of the side trace 11, so that it is not convenient to adjust the side trace 11. To solve the problem, embodiments of the present disclosure provide the following technical solutions.

Figure 5:
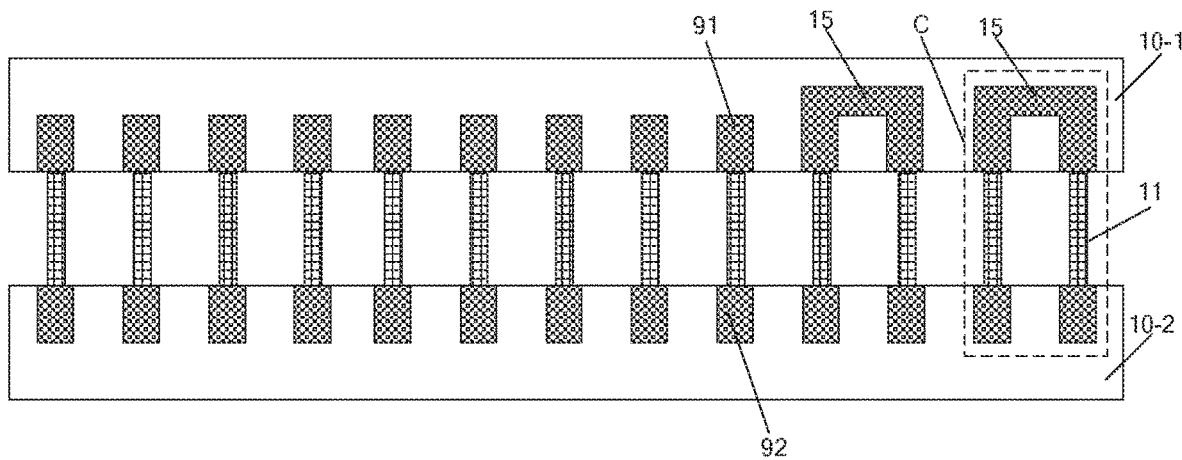
FIG. 5 is a schematic diagram of a display substrate according to an embodiment of the present disclosure.
Figure 8:
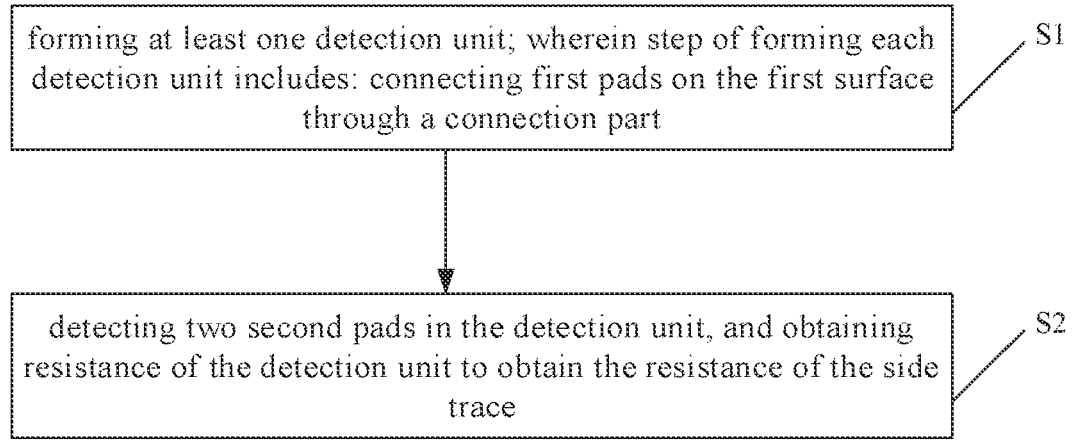
FIG. 8 is a flowchart of a method for detecting resistance of a side trace of a display substrate according to an embodiment of the present disclosure.

In a first aspect, with reference to FIGS. 5 and 8, an embodiment of the present disclosure provides a method for detecting resistance of a side trace of a display substrate, and the display substrate may be the display substrate described above. The method includes the following steps.

In S1, at least one detection unit C is formed; a step of forming each of the at least one detection unit C includes: connecting at least two first pads 91 on the first surface 10-1 through a connection part 15 together, as shown in FIG. 3.

Specifically, the connection part 15 may be formed through a patterning process in step S1, and at this time, the connection part 15 may connect two first pads 91 together to form the detection unit C. It can be understood that each detection unit C includes one connection part 15, two first pads 91, two second pads 92, and two side traces.

In S2, the two second pads 92 of the detection unit C are detected and resistance of the detection unit C is obtained to obtain the resistance of the side trace.

Specifically, in step S2, the two second pads 92 of the detection unit C are taken as test points, at this time, the two test points may be measured using a resistance measuring device, so as to obtain a total resistance of the connection part 15, the two first pads 91, the two second pads 92, and the two side traces in each detection unit C, and resistances of the connection part 15, the two first pads 91, and the two second pads 92 can be directly obtained because each of them is disposed on only one side of the base substrate 10, and at this time, the resistance of each side trace can be directly calculated.

With the method for detecting the resistance of the side trace according to the embodiment of the present disclosure, the resistance of the side trace can be obtained by detecting the second pads 92 on the second surface 10-2, and thus, the side process can be adjusted according to the detected resistance value of the side trace, so as to improve display performance of the display panel.

In some embodiments, in order to make the detected resistance of the side trace more accurate, in step S1, a plurality of detection units C may be formed, and in step S2, the resistance of the side trace may be obtained by taking an average according to the number of the side traces of the detection units C formed in step S1 and the resistance value obtained by measuring the second pads 92 in each detection unit C. The specific number of the formed detection units C may be specifically set according to the set number of the side traces. Specifically, the larger the number of the side traces is, the more detection units C may be formed, so as to ensure detection accuracy of the resistance value of the side trace.

In some embodiments, in order to facilitate arrangement of the connection part 15 in the detection unit C, in step S1, two adjacent first pads 91 may be connected through the connection part 15 to form the detection unit C. In a case where a plurality of detection units C are formed, the first pads 91 in each detection unit C are disposed adjacent to each other, and the two first pads 91 in different detection units are different, so as to facilitate the arrangement of the connection part 15.

Figure 6:
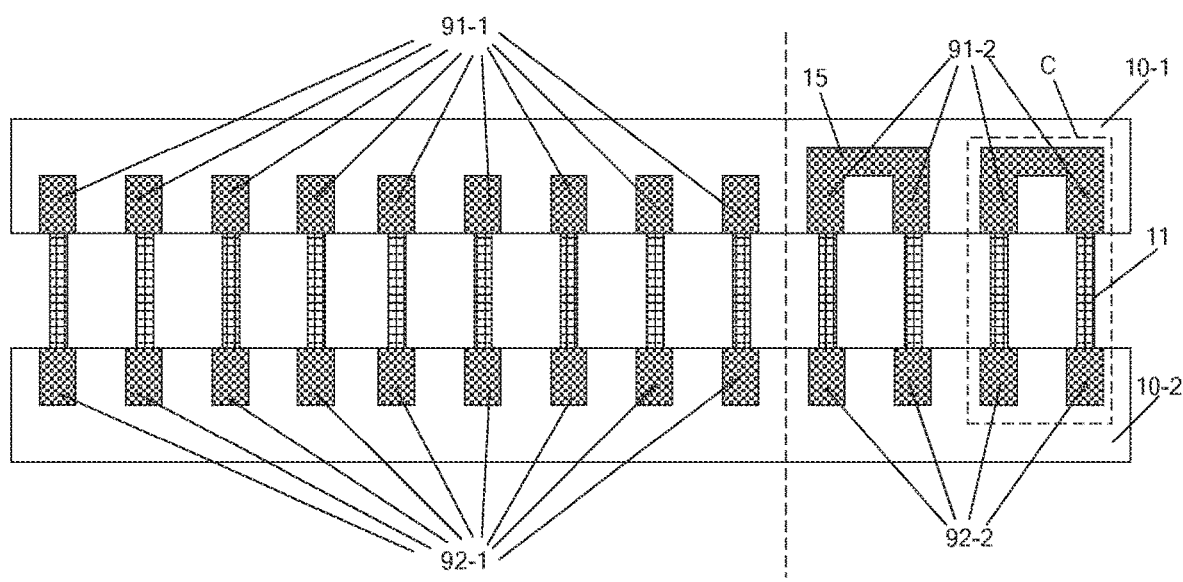
FIG. 6 is a schematic diagram of another display substrate according to an embodiment of the present disclosure.
Figure 7:
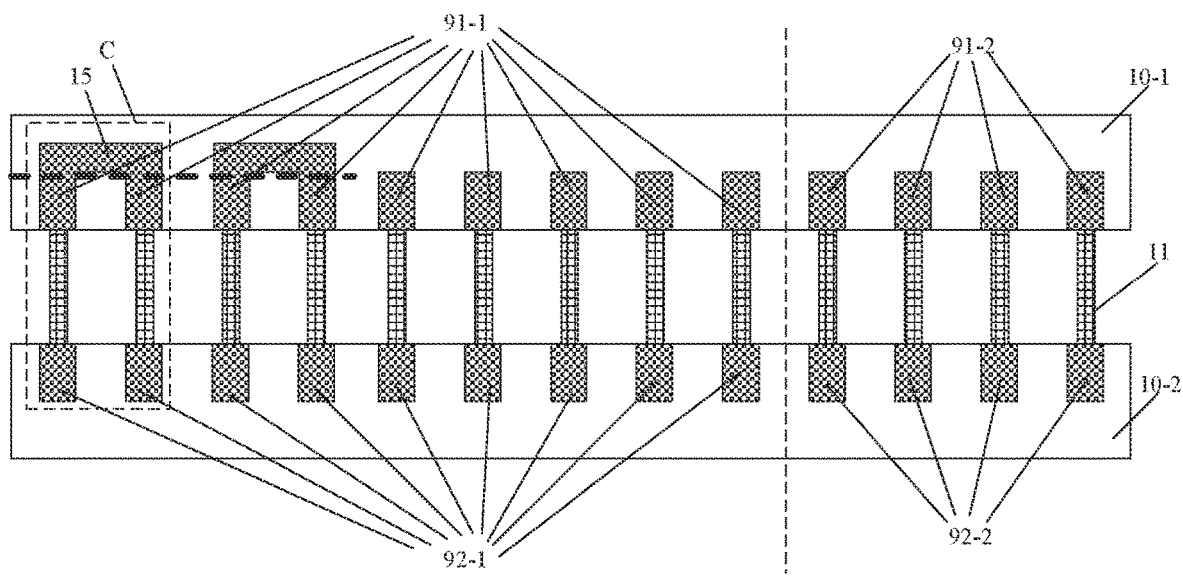
FIG. 7 is a schematic diagram of yet another display substrate according to an embodiment of the present disclosure.

As shown in FIGS. 6 and 7, the plurality of first pads 91 in the display substrate in an embodiment of the present disclosure includes a plurality of first signal pads 91-1 and a plurality of first redundant pads 91-2. Correspondingly, the plurality of second pads 92 includes a plurality of second signal pads 92-1 and a plurality of second redundant pads 92-2. In some embodiments, forming the detection unit C in step S1 specifically includes: connecting two first redundant pads 91-2 through the connection part 15 to form the detection unit C, as shown in FIG. 6. The reason for connecting two first redundant pads 91-2 through the connection part 15 to form the detection unit C is that the connection part 15 does not need to be cut off after the test is completed, and in this case normal operation of the display substrate is not affected.

In some embodiments, forming the detection unit C in step S1 may specifically include: connecting two first signal pads 91-1 through the connection part 15 to form the detection unit C, as shown in FIG. 7. In this case, after step S2, step S3 of cutting off the connection part 15 of the detection unit C is included to prevent the first signal pads 91-1 from being short-circuited to affect normal transmission of signals on the display substrate.

In some embodiments, step S3 may specifically include cutting off the connection part 15 of the detection unit C by laser. In this way, signals transmitted by the respective first signal pads 91-1 can be separated.

In a second aspect, an embodiment of the present disclosure further provides a display substrate, on which detection of a side trace can be performed, and a specific detecting method is as described above. The basic structure of the display substrate in the embodiment of the present disclosure is as described above. In particular, in the embodiment of the present disclosure, at least one connection part 15 is further disposed on the first surface 10-1 of the display substrate, and each connection part 15 is configured to connect two first pads 91, and at this case, the detection unit C can be formed.

Because the display substrate in the embodiment of the present disclosure includes the connection part 15 for connecting two first pads 91, the resistance of the side trace can be obtained by detecting the second pads 92 on the second surface 10-2 and corresponding to the first pads 91 connected to a same connection part 15 (the specific detecting method is as described above). In this way, the side process can be adjusted according to the detected resistance value of the side trace, so as to improve display performance of the display panel.

In the display substrate according to an embodiment of the present disclosure, there are a plurality of the connection parts 15. Each connection part 15 connects two first pads 91, two second pads 92, and two side traces connecting the first pads 91 with the second pads 92 to form one detection unit C; the plurality of connection parts 15 may form a plurality of detection units C, and in this case, the resistance of each detection unit C can be obtained through the second pads 92 of each detection unit C, and then the resistance of the side trace can be obtained by taking an average according to the number of the side traces of the formed detection units C. The specific number of the formed detection units C may be specifically set according to the set number of the side traces. Specifically, the larger the number of the side traces is, the more detection units C may be formed, so as to ensure detection accuracy of the resistance value of the side trace.

In some embodiments, in order to facilitate arrangement of the connection part 15, the two first pads 91 connected by each connection part 15 are disposed adjacent to each other. In a case of a plurality of connection parts 15, the first pads 91 connected to different connection parts 15 are different.

The plurality of first pads 91 in the display substrate in an embodiment of the present disclosure includes a plurality of first signal pads 91-1 and a plurality of first redundant pads 91-2. Correspondingly, the plurality of second pads 92 includes a plurality of second signal pads 92-1 and a plurality of second redundant pads 92-2.

In some embodiments, the connection part 15 connects two first redundant pads 91-2, so as to form the detection unit C. The reason for connecting two first redundant pads 91-2 through the connection part 15 to form the detection unit C is that the connection part 15 does not need to be cut off after the test is completed, and in this case normal operation of the display substrate is not affected.

In some embodiments, the connection part 15 connects two first signal pads 91-1, so as to form the detection unit C. It should be understood that, in this case, after the detection of the display substrate is completed, the connection part 15 needs to be cut off to prevent the first signal pads 91-1 from being short-circuited to affect normal transmission of signals on the display substrate.

It will be understood that the above embodiments are merely exemplary embodiments adopted to illustrate the principles of the present disclosure, but the present disclosure is not limited thereto. It will be apparent to those skilled in the art that various modifications and improvements can be made without departing from the spirit and scope of the present disclosure, and such modifications and improvements are also considered to be within the scope of the present disclosure.

The invention claimed is:

1. A method for detecting resistance of a side trace of a display substrate, wherein the display substrate comprises: a base substrate comprising a first surface and a second surface opposite to each other; a plurality of first pads disposed at intervals on the first surface; and a plurality of second pads disposed at intervals on the second surface; the first pad being electrically connected to a corresponding second pad through a side trace; the plurality of first pads comprise: a plurality of first signal pads and a plurality of first redundant pads; the plurality of second pads comprise: a plurality of second signal pads and a plurality of second redundant pads; the plurality of first signal pads and the plurality of second signal pads are arranged in one-to-one correspondence; the plurality of first redundant pads and the plurality of second redundant pads are arranged in one-to-one correspondence; the method comprising:

forming at least one detection unit, wherein forming the detection unit comprises: connecting two first redundant pads of the plurality of first redundant pads through the connection part; and detecting two second redundant pads corresponding to the two first redundant pads in the detection unit, and obtaining resistance of the detection unit to obtain the resistance of the side trace.

2. The method of claim 1, wherein
the step of forming the detection unit comprises: connecting two of the plurality of first signal pads through the connection part.

3. The method of claim 2, wherein after the steps of detecting two second pads in the detection unit, and obtaining resistance of the detection unit to obtain the resistance of the side trace, the method further comprises: cutting off the connection part of each detection unit.

4. The method of claim 3, wherein the step of cutting off the connection part of each detection unit comprises: cutting off the connection part in each detection unit with laser.

5. The method of claim 1, wherein forming the detection unit comprises: connecting two adjacent first redundant pads through the connection part.

6. A display substrate, comprising:
a base substrate having a first surface and a second surface opposite to each other;
a plurality of first pads arranged at intervals on the first surface, wherein the plurality of first pads comprise: a plurality of first signal pads and a plurality of first redundant pads;
a plurality of second pads arranged at intervals on the second surface and in one-to-one correspondence with the plurality of first pads, wherein the plurality of second pads comprise: a plurality of second signal pads and a plurality of second redundant pads, the plurality of first signal pads and the plurality of second signal pads are arranged in one-to-one correspondence, and the plurality of first redundant pads and the plurality of second redundant pads are arranged in one-to-one correspondence;
a plurality of side traces each configured to connect one of the plurality of first pads to a corresponding second pad; and
at least one connection part each configured to connect any two of the plurality of first redundant pads.

7. The display substrate of claim 6, wherein
the connection part connects two first signal pads.

8. The display substrate of claim 6, wherein the two first redundant pads connected by the connection part are adjacent to each other.

9. The display substrate of claim 6, wherein a pixel unit is on the first surface of the base substrate, and the first pad is connected to the pixel unit through a signal introduction line; a plurality of third pads are arranged at intervals on the second surface of the base substrate, and the plurality of second pads are connected to the plurality of third pads in one-to-one correspondence.

10. The display substrate of claim 6, wherein a plurality of third pads are arranged at intervals on the first surface of the base substrate, the plurality of first pads are connected to the plurality of third pads in one-to-one correspondence, a pixel unit is on the second surface of the base substrate, and the second pad is connected to the pixel unit through a signal introduction line.

11. The display substrate of claim 6, wherein the at least one connection part comprises a plurality of connection parts, and the two first redundant pads connected by different connection parts are different.

* * * * *